(12) United States Patent
Osada et al.

(10) Patent No.: US 7,898,094 B2
(45) Date of Patent: Mar. 1, 2011

(54) EPOXY RESIN COMPOSITION FOR ENCAPSULATING SEMICONDUCTOR DEVICES AND SEMICONDUCTOR DEVICES ENCAPSULATED THEREWITH

(75) Inventors: Shoichi Osada, Annaka (JP); Takayuki Aoki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 671 days.

(21) Appl. No.: 11/699,370

(22) Filed: Jan. 30, 2007

(65) Prior Publication Data
US 2007/0179259 A1    Aug. 2, 2007

(30) Foreign Application Priority Data

Jan. 31, 2006 (JP) .............................. 2006-022789
Jan. 26, 2007 (JP) .............................. 2007-016102

(51) Int. Cl.
*H01L 23/29* (2006.01)
*C08L 63/00* (2006.01)
*B32B 27/38* (2006.01)

(52) U.S. Cl. ...................... 257/793; 257/789; 257/795; 523/466; 525/524

(58) Field of Classification Search ........................ None
See application file for complete search history.

(56) References Cited

U.S. PATENT DOCUMENTS 5,001,174 A * 3/1991 Yanagisawa et al. ........ 523/443
5,064,881 A * 11/1991 Togashi et al. .............. 523/443
5,494,950 A * 2/1996 Asakage et al. ............. 523/427
2002/0053302 A1* 5/2002 Endo et al. ............. 106/287.22

FOREIGN PATENT DOCUMENTS

| JP | 06-220168 | * | 8/1994 |
| JP | 3137202 B2 | | 12/2000 |
| JP | 3451104 B2 | | 7/2003 |
| JP | 3537859 B2 | | 3/2004 |
| JP | 3551281 B2 | | 5/2004 |
| JP | 2005-15689 A | | 1/2005 |

OTHER PUBLICATIONS

Machine translation of JP 06-220168, provided by the JPO website (1994).*

* cited by examiner

*Primary Examiner*—Michael J Feely
(74) *Attorney, Agent, or Firm*—Birch, Stewart, Kolasch & Birch, LLP

(57) ABSTRACT

An epoxy resin composition comprising: (A) an epoxy resin having at least three epoxy groups per molecule and an epoxy equivalent of 170 or lower; (B) an epoxy resin having a phenolic nucleus and two epoxy groups in such an amount that a weight ratio of the epoxy resin (B) to the epoxy resin (A) ranges from 35/65 to 65/35; (C) a phenolic curing agent in such an amount that a molar ratio of phenolic hydroxyl groups to the whole epoxy groups in the composition ranges from 0.5 to 1.5; and (D) an inorganic filler in an amount of from 86 to 92 wt %, based on a total weight of the composition. The composition provides encapsulated semiconductor devices much less warped than those encapsulated with a conventional composition.

9 Claims, 1 Drawing Sheet

EPOXY RESIN COMPOSITION FOR ENCAPSULATING SEMICONDUCTOR DEVICES AND SEMICONDUCTOR DEVICES ENCAPSULATED THEREWITH

This application claims benefit of Japanese Patent application No. 2006-022789 filed on Jan. 31, 2006, and Japanese Patent application No. 2007-16102, filed on Jan. 26, 2007, the contents of which are hereby incorporated by reference.

FIELD OF THE INVENTION

The present invention relates to an epoxy resin composition for encapsulating semiconductor devices without causing warpage of a semiconductor device and, therefore, particularly suitable for encapsulating semiconductor devices to be surface mounted.

BACKGROUND OF THE INVENTION

Conventionally, an epoxy resin is used for encapsulating because of its good molding, adhesion, mechanical and moisture resistant properties. Recently, as consumers prefer smaller, lighter and more sophisticated electronic devices, more integrated semiconductor devices are required and requirements for an epoxy resin used for encapsulating the devices are getting severer.

As an IC or LSI package, high-density packages such as Lead on Chip (LOC) type TSOP, Ball Grid Array, and QFN are predominantly used. A problem with these packages is a warpage after encapsulation due to imbalanced resin thickness between the upper and lower sides of the package or a one-side encapsulation. One method to prevent the warpage is to increase a degree of cross linkage and a glass transition temperature of an encapsulating resin. However, this causes an increase in modulus of elasticity of a cured product. Further, a higher reflow temperature of Pb-free solder causes increase in susceptibility to moisture, so that a problem of peeling at an interface between a cured product of an epoxy resin and a substrate, or between a semiconductor device and an encapsulating epoxy resin occurs. To suppress moisture absorption, larger amount of inorganic filler may be incorporated in a composition. However, a composition containing such a larger amount of filler has an increased viscosity to cause problems in molding such as defects in a cured product and wire sweep. To decrease viscosity and to improve reflow resistance, use is made of a resin having low melt viscosity. However, due to a low glass transition temperature, impurity ions in the composition tend to migrate when exposed to a high temperature for a long time, resulting in low reliability of a semiconductor package.

Japanese Patent No. 3137202 discloses an epoxy resin composition comprising 1,1-bis(2,7-diglycidyloxy-1-naphthyl)alkane. A cured product of the composition is heat and moisture resistant, and overcomes problems of hardness and brittleness of a cured product of a conventional heat resistant epoxy resin.

Japanese Patent Application Laid-Open No. 2005-15689 discloses an epoxy resin composition comprising (A) epoxy resin mixture and (B) a curing agent, wherein the epoxy resin mixture (A) comprising 1,1-bis(2,7-diglycidyloxy-1-naphthyl)alkane (a1) 1-(2,7-diglycidyloxy-1-naphthyl)-1-(2-glycidyloxy-1-naphthyl)alkane (a2), and 1,1-bis(2-glycidyloxy-1-naphthyl)alkane (a3) in an amount of 40 to 95 parts by weight per total 100 parts by weight of components (a1), (a2) and (a3), and (B) a curing agent.

Japanese Patent No. 3451104, 3537859, and 3551281 disclose an epoxy resin composition comprising the epoxy resin represented by the following formula (1).

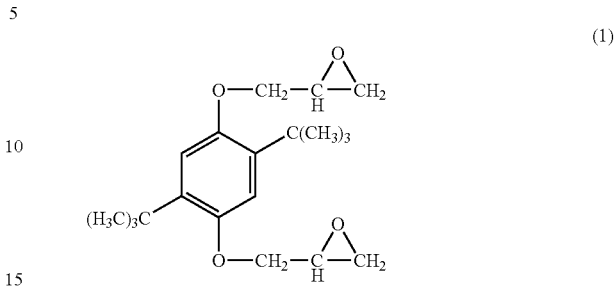

It was found that the composition tend to cause a semiconductor device to warp when it is encapsulated by the composition.

SUMMARY OF THE INVENTION

An object of the present invention is to provide an epoxy resin composition for encapsulating semiconductor devices without causing warpage, and a semiconductor device encapsulated with the resin composition.

The present inventors have found that a composition comprising an epoxy resin blend comprising (A) an epoxy resin having at least three epoxy groups per molecule and an epoxy equivalent of 170 or lower and (B) an epoxy resin having a diphenolic nucleus and two epoxy groups can attain the above object of the invention. The composition has low viscosity suitable for molding. Further, it can contain inorganic filler in an amount so high as 86 to 92 wt % of the composition, which also contributes to suppress warpage. The composition forms a cured product having no defects and no wire sweep. It has high glass transition temperature and reflow resistance.

Thus, the present invention is an epoxy resin composition comprising:

(A) an epoxy resin having at least three epoxy groups per molecule and an epoxy equivalent of 170 or lower;

(B) an epoxy resin having a phenolic nucleus and two epoxy groups in such an amount that a weight ratio of the epoxy resin (B) to the epoxy resin (A) ranges from 35/65 to 65/35;

(C) a phenolic curing agent in such an amount that a molar ratio of phenolic hydroxyl groups to the whole epoxy groups in the composition ranges from 0.5 to 1.5; and (D) an inorganic filler in an amount of from 86 to 92 wt %, based on a total weight of the composition.

Figure 1:
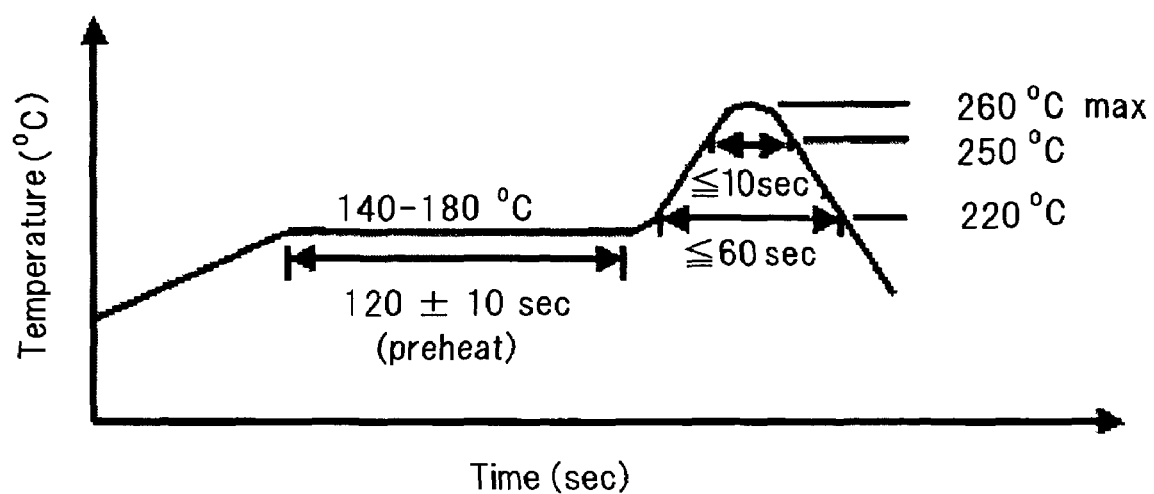
FIG. 1 is a temperature profile chart of an IR reflow furnace used in the present Example.

PREFERRED EMBODIMENTS OF THE INVENTION (A) Epoxy Resin

The epoxy resin (A) used in the present invention has at least three epoxy groups per molecule and an epoxy equivalent of 170 or lower, preferably from 100 to 170, more preferably from 120 to 170. A composition comprising the epoxy resin (A) can form a cured product which has high degree of cross linkages and accordingly high glass transition temperature. The cured product has a small thermal expansion coefficient, suppressing warpage of a semiconductor package. In the present invention, an epoxy equivalent is measured by a perchloric acid method.

Examples of the epoxy resin (A) are as shown below. A mixture of two or more of them can be used.

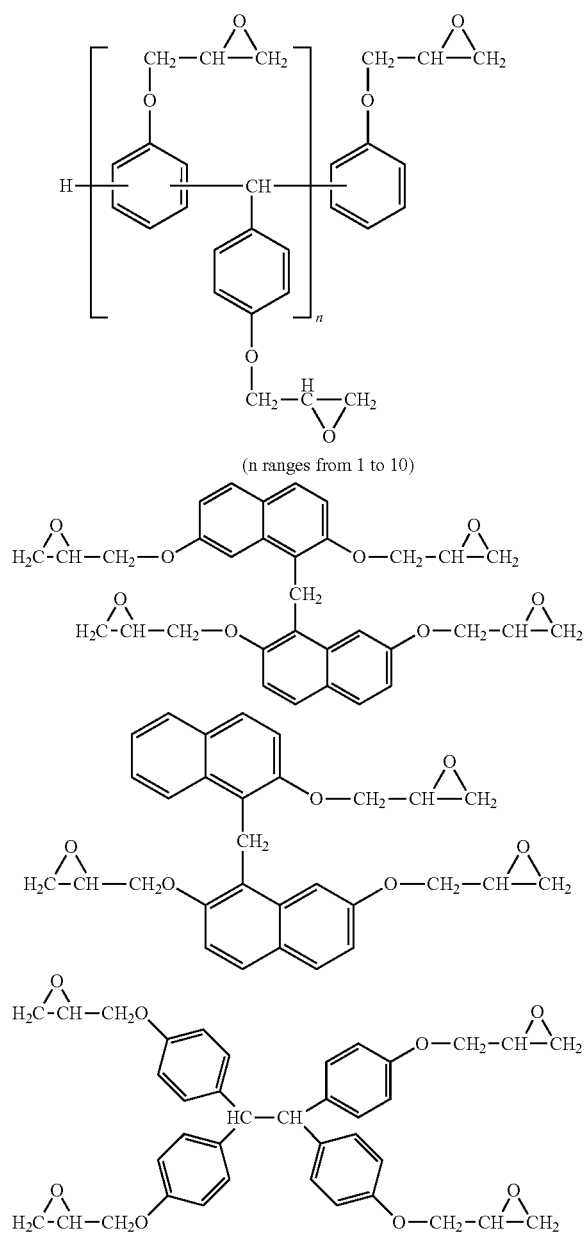

(B) Epoxy Resin

The epoxy resin (B) contains one diphenolic nucleus to have mold shrinkage smaller than other epoxy resins such as a biphenyl-type epoxy resins, bisphenol A-epoxy resins, which can suppress warpage of a semiconductor device encapsulated therewith. The epoxy resin (B) has a viscosity measured with an ICI cone/plate viscometer according to ASTM D4287 at 150° C., hereinafter referred to as ICI viscosity, preferably of from 0.005 to 0.01 Pa·s, more preferably from 0.005 to 0.009 Pa·s. An epoxy resin having a ICI viscosity below the aforesaid lowest limit tends to contain unreacted reactants used in a reaction to introduce glycydyl groups, and accordingly has more volatiles at 150° C., which may cause voids in a cured product. An epoxy resin which has an ICI viscosity higher than the aforesaid higher limit tends to cause wire sweep, i.e, deformation of wires used for bonding, during molding.

Preferably, the epoxy resin (B) of the following formula (1) is used.

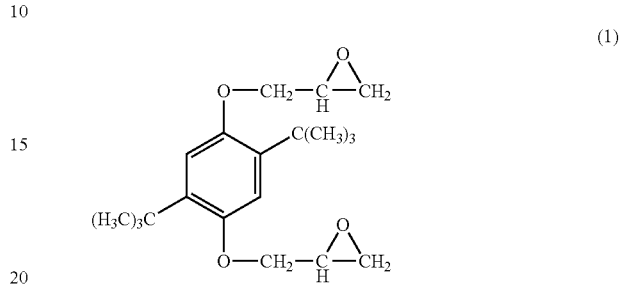

It was found that concomitant use of the epoxy resin of the above formula (1) with the component (A) can form an encapsulated semiconductor device which has no defects in the encapsulating cured product without deformed wire, and is little warped, reflow resistant and resistant to high temperature. Such a concomitant used is not suggested in the aforesaid Japanese Patents No. 3451104, No. 3537859, and No. 3551281.

The components (A) and (B) are used in a weight ratio of from 35/65 to 65/35. If the ratio is smaller than the aforesaid lower limit, a glass transition temperature of a cured product is lower than 140° C., causing warpage or degraded long-term heat resistance. If the ratio is above the aforesaid higher limit, such a composition has higher minimum melt viscosity, causing wire sweep or defects in a cured product. Preferably, the aforesaid epoxy resins have a hydrolyzable chloride content of 1000 ppm or lower, more preferably of 500 ppm or lower, and each of sodium and potassium contents of 10 ppm or lower. If hydrolyzable chloride content exceeds 1000 ppm, or sodium or potassium content exceeds 10 ppm, a cured product of such an epoxy resin may not be moisture resistant when an encapsulated semiconductor device is exposed to a high temperature and a high humidity for a prolonged period of time.

Other Epoxy Resins

The present component may contain other epoxy resin besides the aforesaid epoxy resins (A) and (B). Examples of the other epoxy resins include novolac type epoxy resins such as phenol novolac type epoxy resins and cresol novolac type epoxy resins; triphenol alkane epoxy resins such as triphenol methane type epoxy resins, and triphenol propane type epoxy resins; biphenyl type epoxy resins; phenolaralykyl type epoxy resins, biphenylaralkyl type epoxy resins, heterocyclic type epoxy resins, naphthalenic backbone-containing epoxy resins besides the aforesaid epoxy resin (A); bisphenol type epoxy resins such as bisphenol A type epoxy resins, and bisphenol F type epoxy resins; stilbene type epoxy resin; halogenated epoxy resin; and a mixture thereof.

(C) Phenolic Curing Agent

Examples of the phenolic curing agent (C) include cresol novolac resins, phenol novolac resins, phenolic resins containing naphthalenic backbone, aralykyl type phenolic resins, triphenolalkane type phenolic resins, aralykyl type phenolic resins containing biphenyl backbone, biphenyl type phenolic resins, alicyclic phenolic resins, heterocyclic phenolic resins, bisphenol type phenolic resins such as bisphenol A type resins and bisphenol F type resins, and a mixture thereof. Among these, cresol novolac resins, phenolic resins containing naphthalenic backbone, and aralykyl type phenolic resins containing biphenyl backbone are preferred.

Preferably, the curing agent has each of sodium and potassium contents of 10 ppm or lower. If sodium or potassium content exceeds 10 ppm, a cured product of such an epoxy resin may not be sufficiently moisture resistant to long-term exposure to a high temperature and a high humidity.

The phenolic curing agent (C) is contained in the composition in such an amount that a molar ratio of phenolic hydroxyl groups in the curing agent to whole epoxy groups in the composition ranges from 0.5 to 1.5, preferably from 0.8 to 1.2.

(D) Inorganic Filler

As the inorganic filler, any known filler can be used. Examples of the inorganic filler include silica such as fused silica, and crystalline silica; alumina, silicon nitride, aluminum nitride, boron nitride, titanium oxide, glass fiber, and antimony trioxide, among which fused silica is preferred. Average particle size and shape of the filler may be selected according to intended properties of the composition and a cured product thereof. Preferably, the inorganic filler has an average particle size of from 5 to 30 μm. The inorganic filler (D) is contained in the composition in an amount of from 86 to 92 wt %, preferably from 86 to 90 wt %, based on a total weight of the composition. Such a high content of the inorganic filler contributes to suppress warpage of an encapsulated semiconductor device. The present composition is therefore advantageously used for encapsulating semiconductor devices to be surface mounted. If the content of the inorganic filler (D) is less than the aforesaid lower limit, a cured product may have larger coefficient of thermal expansion and larger moisture intake, causing larger warpage and poorer reflow resistance. If the content exceeds the aforesaid upper limit, a composition has higher minimum melt viscosity, causing wire sweep and defects in a cured product thereof. A particle size may be a weight average particle size or a median diameter measured by laser diffraction method.

The inorganic filler is preferably pretreated with a coupling agent such as a silane coupling agent or a titanate coupling agent to increase affinity to the resins. Examples of preferred coupling agent include epoxy silanes such as γ-glycidoxypropyltrimethoxysilane, γ-glycidoxypropylmethyldiethoxysilane, β-(3,4-epoxycyclohexyl)ethyltrimethoxysilane; aminosilanes such as N-β(aminoethyl)-γ-aminopropyltrimethoxysilane, a reaction product of imidazole with γ-glycidoxypropyltrimethoxysilane, γ-aminopropyltriethoxysilane and N-phenyl-γ-aminopropyltrimethoxysilane; mercaptosilanes such as γ-mercaptosilane and γ-episulphidoxypropyltrimethoxysilane. A surface treatment can be performed according to a conventional method.

Optional Components

To promote curing reaction of the epoxy resins with the curing agent, a curing accelerator is preferably used. Examples of the curing accelerator include phosphorous compounds such as triphenylphosphine, tributylphosphine, tri(p-methylphenyl)phosphine, tri(nonylphenyl)phosphine, triphenyhlphosphine/triphenylborane, tetraphenylphosphine/tetraphenylborate, and an adduct of triphenylphosphine with p-benzoquinone; tertiary amine compounds such as triethylamine, benzyldimethylamine, α-methylbenzyldimethylamine, and 1,8-diazabicyclo(5.4.0)undec-7-ene; imidazols such as 2-ethyl-4-methylimidazol, 2-methylimidazol, 2-phenylimidazol, and 2-phenyl-4-methylimidazol. These curing accelerators may be microencapsulated.

The curing accelerator may be contained in the composition in an amount enough to accelerate curing. Preferably, the accelerator is contained in an amount of from 0.1 to 8 parts by weight, more preferably from 0.5 to 5 parts by weight, based on total 100 parts by weight of the components (A) and (B).

Various kinds of additives may be incorporated as desired. Examples of the additives include wax such as carnauba wax, oxidized polyethylene, and montanic acid esters; colorants such as carbon black; flame retardants such as zinc molybdate deposited on talc, zinc molybdate deposited on zinc, phosphazene compounds, and silicone compounds; halogen trapping agents such as hydrotalcite, bismuth compounds, and oxides of rare earth metals; and aforesaid coupling agents to improve adhesion to a substrate.

A release agent may also be incorporated in the composition. Examples of the release agent include wax such as carnauba wax, Rice Bran wax, polyethylene, oxidized polyethylene, montanic acid, esters of montanic acid with a saturated alcohols, 2-(2-hydroxyethylamino)ethanol, ethylene glycol, and glycerin; stearic acid, stearates, stearic acid amides, ethylene bisstearic acid amide, and ethylene/vinylacetate copolymer; and a mixture thereof.

The release agent may be incorporated in the composition in an amount of from 0.1 to 5 parts by weight, preferably from 0.3 to 4 parts by weight, based on total 100 parts by weight of components (A), (B), (C) and (D).

Preparation of the Epoxy Resin Composition

The present composition can be prepared by (i) mixing the components (A) to (D) and an optional component in a predetermined weight ratio with a mixer, (ii) melt-mixing the mixture obtained in the step (i) with a heated roller mill, a kneader, or an extruder, (iii) cooling the molten mixture, and (iv) pulverizing the mixture.

In the step (i), a silane coupling agent is preferably added to suppress frictional heating or to facilitate wetting. Any of the silane coupling agents described above for surface treating the inorganic filler (D) can be used.

The resin composition thus obtained can be used for encapsulating various semiconductor devices. A typical molding method is a low pressure transfer molding. The molding is preferably performed at a temperature of from 150 to 185° C. for 30 to 180 seconds. Post curing is performed preferably at a temperature of from 150 to 185° C. for 2 to 20 hours.

EXAMPLES

The present invention will be explained with reference to the examples but not limited thereto.

Examples 1-7, Referential Examples 1-4, Comparative Examples 1-4

Components in amounts shown in Table 1 were melt-mixed with a heated double roller mill. By cooling and then pulverizing the molten mixture, an epoxy resin composition for encapsulating semiconductor devices was obtained. Each material indicated in Table 1 is as shown below.

(A) Epoxy Resin

A-1: the epoxy resin of the following formula having an epoxy equivalent of 168.

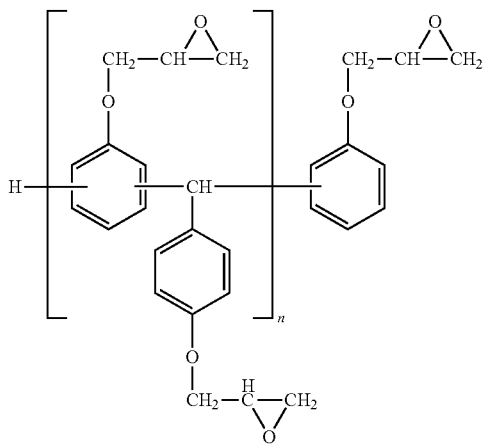

(n is 1.2 on average.)

A-2: the epoxy resin of the following formula having an epoxy equivalent of 156.

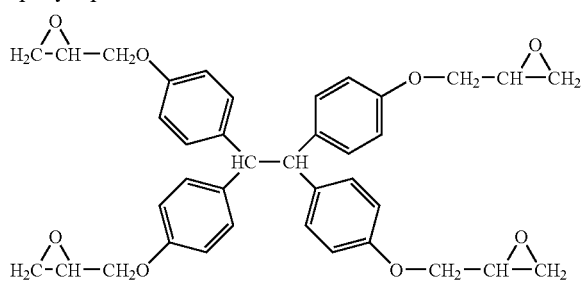

(B) Epoxy Resin

B-1: the epoxy resin of the following formula having an epoxy equivalent of 156 and an ICI viscosity of 0.008 Pa·s.

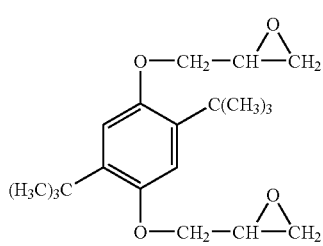

An epoxy resin used in Comparative Example: YX-4000K having an epoxy equivalent of 190, ex Japan Epoxy Resins Co., Ltd.

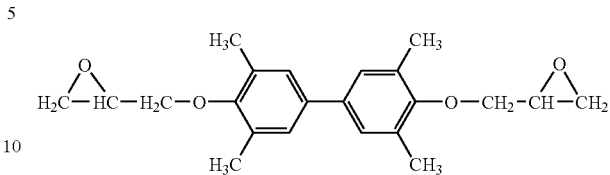

(C) Phenolic Curing Agent

C-1: Creseol Novolac type resin, H-4, ex Meiwa Plastic Industries, Ltd., having a phenolic hydroxyl group equivalent of 110.

C-2: Biphenylaralkyl type phenolic resin, MEH-7800SS, ex Meiwa Plastic Industries, Ltd., having a phenolic hydroxyl group equivalent of 175.

C-3: Naphthalenic backbone-containing phenolic resin of the following formula, Kayahard NHN, Nippon Kayaku Co., Ltd.

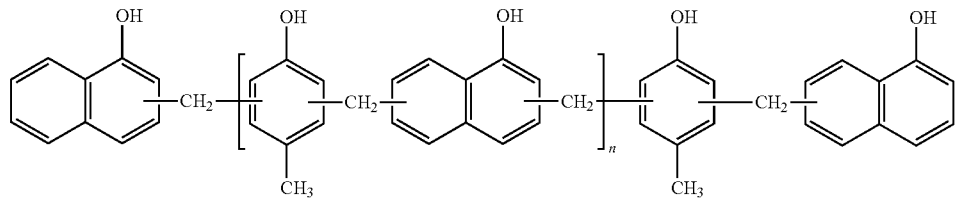

(D) Inorganic Filler

D-1: Spherical fused silica, ex Tatsumori Co.

Other Components (i) Curing Accelerator

Curing accelerator-1: 2-ethyl-4-methylimidazol, ex Shikoku Chemical Co.

Curing accelerator-2: triphenylphosphine (ii) Releasing Agent: Carnauba Wax, ex Nikko Fine Products Co.

(iii) Flame Retardant

Flame retardant-1: zinc molybdate deposited on Zinc, KEMGARD 911B, ex Sherwin Wiliams Co.

Flame retardant-2: Phophazene compound, SPE-100, ex Otsuka Chemical Co., Ltd.

(iv) Silane Coupling Agent: γ-glycidoxypropyltrimethoxysilane, KBM-403, ex Shin-Etsu Chemical Co., Ltd.

(v) Colorant: Carbon black, Denka Black, ex Denki Kagaku Kogyo Kabushiki Kaisya.

(vi) Ion Trapping Agent: Hydrotalcite Compound, DHT-4A-2, ex Kyowa Chemical Industry Co., Ltd.

The compositions prepared were evaluated according to the following methods. The results are as shown in Table 1.

(a) Spiral Flow

Using a metal mold according to Epoxy Molding Materials Institute (E.M.M.I.) standard, spiral flow was measured at 6.9 N/mm² and at 175° C.

(b) Melt Viscosity

Using a Koka type flow tester provided with a 1 mm-diameter nozzle, melt viscosity was measured at 175° C. and at a pressure of 10 kgf.

(c) Glass Transition Temperature and Linear Thermal Expansion Coefficient

Using a metal mold according to E.M.M.I. standard, a test piece having a size of 5×5×15 mm was prepared at 6.9 N/mm² by heating at a temperature of 175° C. for 120 seconds. A length (L) of the test piece was measured with a micrometer down to the 0.01 mm. The test piece was set in a thermal dilatometer and heated to 300° C. at a temperature rise rate of 5° C./min under a load of 19.6 mN. Change in length was plotted versus temperature. Tangential lines in temperature regions below and above glass transition temperature were drawn and their slopes were calculated according to the following equations:

Linear expansion coefficient below glass transition temperature=($L$ at $A2$–$L$ at $A1$)/[($A2$–$A1$)×$L$×1000]

Linear expansion coefficient above glass transition temperature=($L$ at $B2$–$L$ at $B1$)/[($B2$–$B1$)×$L$×1000]

In the above equations, A1 and A2 are arbitrary temperatures below glass transition temperature and B1 and B2 are arbitrary temperatures above glass transition temperature.

(d) Wire Sweep Rate

A 7×7×0.30 mm silicon chip was bonded to a 100 pin-QFP flame (Cu, spot Ag plating). An aluminum electrode on the chip surface was wire-bonded to a lead frame with a 23 μm φ gold wire with a loop height of 200 μm, a wire length of 4 mm, and a ball diameter of 75 μm. Then, an epoxy resin composition was transfer molded at 175° C. and at a mold pressure of 6.9 N/mm² for 9 seconds to encapsulate the chip. A rate in percent of deformation in wire-bonds was measured with a microfocus X-ray TV inspection system, ex Pony Industry Co., Ltd.

(e) Warpage of a Package

A 10×10×0.3 mm silicon chip was mounted on a 0.40 mm thick BT resin substrate. Then, an epoxy resin composition was transfer molded at 175° C. and at a mold pressure of 6.9 N/mm² for 2 minutes to encapsulate the chip. A post-cure was performed at 175° C. for 5 hours. A difference in height between diagonal vertexes of the package thus obtained was measured with a laser coordinate measuring machine. A warpage of the package was determined as a maximum difference out of 20 packages.

(f) Reflow Resistance

The package whose warpage was measured was allowed to stand in an environment of at 85° C. and a relative humidity of 60% for 168 hours. Then, the package was passed through an IR reflow furnace with a temperature profile shown in FIG. 1, wherein temperature is surface temperature of a package, three times. Then, the package was observed with an ultrasonic inspection machine and a number of packages which showed a crack or a peeling was counted out of 20 packages.

(g) Heat Resistance

A 6×6 mm silicone chip having aluminum wirings at line/space being 5 μm/5 μm thereon was bonded to a 14 pin-DIP flame (42 alloy). An aluminum electrode on the chip surface was wire-bonded to a lead frame with a 25 μm 9 gold wire. Then, an epoxy resin composition was transfer molded at 175° C. and at a pressure of 6.9 N/mm² for 120 seconds to encapsulate the chip. The package obtained was post-cured at 180° C. for 4 hours. A total 20 packages were prepared. The packages were kept at 175° C. with −10 DC voltage applied thereto for 1000 hours and, then, resistivity of each package was measured and averaged.

TABLE 1

| | Component, part by weight | Example | | | | | | | Referential Examples | |
|---|---|---|---|---|---|---|---|---|---|---|
| | | 1 | 2 | 3 | 4 | 5 | 6 | 7 | 1 | 2 |
| (A) | Epoxy resin A-1 | 38 | 30 | 22 | 30 | 30 | 30 | | 43 | 18 |
| | Epoxy resin A-2 | | | | | | | 30 | | |
| (B) | Epoxy resin B-1 | 22 | 30 | 38 | 30 | 30 | 30 | 30 | 18 | 43 |
| | Comparative epoxy resin | | | | | | | | | |
| | Weight ratio of (A)/(B) | 63/37 | 50/50 | 37/63 | 50/50 | 50/50 | 50/50 | 50/50 | 70/30 | 30/70 |
| (C) | Phenolic curing agent C-1 | 40 | 40 | 40 | 40 | | | 40 | 39 | 39 |
| | Phenolic curing agent C-2 | | | | | | 40 | | | |
| | Phenolic curing agent C-3 | | | | | 47 | | | | |
| (D) | Inorganic filler D-1 | 900 | 900 | 900 | 1100 | 800 | 1300 | 900 | 900 | 900 |
| | Weight % of (D) in composition | 88 | 88 | 88 | 90 | 86 | 92 | 88 | 88 | 88 |
| Others | Curing accelerator-1 | 1 | 1 | 1 | 1 | 1 | 1 | 1 | 1 | 1 |
| | Curing accelerator-2 | | | | | | | | | |
| | Releasing agent | 2 | 2 | 2 | 2 | 2 | 2 | 2 | 2 | 2 |
| | Flame retardant-1 | 5 | 5 | 5 | 5 | 5 | 5 | 5 | 5 | 5 |
| | Flame retardant-2 | 5 | 5 | 5 | 5 | 5 | 5 | 5 | 5 | 5 |
| | Coupling agent | 1 | 1 | 1 | 1 | 1 | 1 | 1 | 1 | 1 |
| | Colorant | 2 | 2 | 2 | 2 | 2 | 2 | 2 | 2 | 2 |
| | Ion trapping agent | 2 | 2 | 2 | 2 | 2 | 2 | 2 | 2 | 2 |
| | Evaluation results | | | | | | | | | |
| (a) | Spiral Flow(cm) | 90 | 120 | 140 | 100 | 100 | 100 | 90 | 70 | 150 |
| (b) | Melt viscosity(Pa·s) | 16 | 8 | 6 | 14 | 12 | 12 | 16 | 22 | 5 |
| (c) | Glass Transition Temperature(° C.) | 163 | 152 | 140 | 152 | 152 | 140 | 160 | 168 | 135 |
| (d) | Linear Thermal Expansion Coefficient(×$10^{-5}$/° C.) | 1.0 | 0.8 | 0.8 | 0.6 | 0.8 | 0.5 | 0.9 | 1 | 0.8 |
| (e) | Wire sweep(%) | <3 | <3 | <3 | <3 | <3 | <3 | <3 | 8 | <3 |
| (f) | Warpage of a package(μm) | 60 | 70 | 90 | 45 | 80 | 40 | 55 | 55 | 120 |

TABLE 1-continued

| | | | | | | | | | | | |
|---|---|---|---|---|---|---|---|---|---|---|---|
| (g) | Reflow | cracks | 0/20 | 0/20 | 0/20 | 0/20 | 0/20 | 0/20 | 0/20 | 0/20 | 0/20 |
| | resistance | peeling | 0/20 | 0/20 | 0/20 | 0/20 | 0/20 | 0/20 | 0/20 | 0/20 | 0/20 |
| (h) | Heat resistance (Ω) | | 20 | 20 | 20 | 20 | 20 | 22 | 21 | 20 | 20 |

| | | | Referential Examples | | Comparative Examples | | | |
|---|---|---|---|---|---|---|---|---|
| | | Component, part by weight | 3 | 4 | 1 | 2 | 3 | 4 |
| (A) | | Epoxy resin A-1 | 30 | 30 | 60 | 30 | | |
| | | Epoxy resin A-2 | | | | | | |
| (B) | | Epoxy resin B-1 | 30 | 30 | | | 46 | |
| | | Comparative epoxy resin | | | | 30 | | 53 |
| | | Weight ratio of (A)/(B) | 50/50 | 50/50 | 100/0 | — | 0/100 | — |
| (C) | | Phenolic curing agent C-1 | | | 40 | 40 | | |
| | | Phenolic curing agent C-2 | | 40 | | | 54 | 47 |
| | | Phenolic curing agent C-3 | 47 | | | | | |
| (D) | | Inorganic filler D-1 | 700 | 1500 | 700 | 1100 | 1300 | 1300 |
| | | Weight % of (D) in composition | 85 | 93 | 86 | 90 | 92 | 92 |
| Others | | Curing accelerator-1 | 1 | 1 | 1 | 1 | 1 | |
| | | Curing accelerator-2 | | | | | 2 | 2 |
| | | Releasing agent | 2 | 2 | 2 | 2 | 2 | 2 |
| | | Flame retardant-1 | 5 | 5 | 5 | 5 | 5 | 5 |
| | | Flame retardant-2 | 5 | 5 | 5 | 5 | 5 | 5 |
| | | Coupling agent | 1 | 1 | 1 | 1 | 1 | 1 |
| | | Colorant | 2 | 2 | 2 | 2 | 2 | 2 |
| | | Ion trapping agent | 2 | 2 | 2 | 2 | 2 | 2 |
| | | Evaluation results | | | | | | |
| (a) | | Spiral Flow(cm) | 120 | 50 | 70 | 90 | 140 | 90 |
| (b) | | Melt viscosity(Pa · s) | 10 | 35 | 22 | 21 | 6 | 20 |
| (c) | | Glass Transition Temperature(° C.) | 152 | 141 | 185 | 130 | 115 | 105 |
| (d) | | Linear Thermal Expansion Coefficient(×10$^{-5}$/° C.) | 1.2 | 0.4 | 1.2 | 0.9 | 0.6 | 0.8 |
| (e) | | Wire sweep(%) | <3 | 15< | <6 | 10 | <3 | 6 |
| (f) | | Warpage of a package(μm) | 130 | 20 | 80 | 100 | 110 | 125 |
| (g) | | Reflow     cracks | 2/20 | 0/20 | 20/20 | 0/20 | 0/20 | 0/20 |
| | | resistance   peeling | 5/20 | 6/20 | — | 0/20 | 0/20 | 0/20 |
| (h) | | Heat resistance (Ω) | 20 | 20 | 20 | 20 | 40 | 50 |

As shown in Table 2, the present compositions can form semiconductor device package having warpage and wire seep rate significantly smaller than those made with conventional compositions. The package is reflow resistant and showed no increase in resistivity. The present epoxy resin composition is useful for encapsulating semiconductor devices.

The invention claimed is:

1. An epoxy resin composition comprising:
(A) an epoxy resin having at least three epoxy groups per molecule and an epoxy equivalent of 170 or lower, wherein said epoxy resin (A) is selected from the group consisting of:

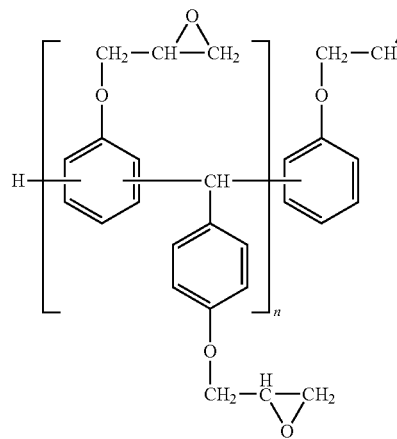

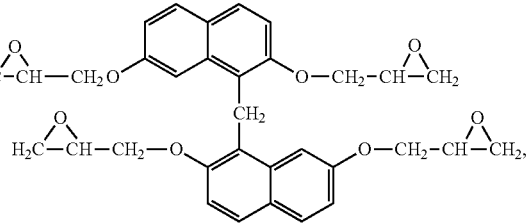

-continued (wherein n ranges from 1 to 10),

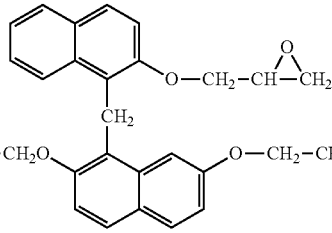

and the mixtures thereof;

(B) an epoxy resin represented by formula (1):

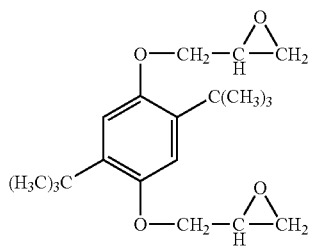

(1)

in such an amount that a weight ratio of the epoxy resin (B) to the epoxy resin (A) ranges from 35/55 to 65/35;

(C) a phenolic curing agent in such an amount that a molar ratio of phenolic hydroxyl groups to the whole epoxy groups in the composition ranges from 0.5 to 1.5; and (D) an inorganic filler in an amount of from 86 to 92 wt %, based on a total weight of the composition.

2. The epoxy resin composition according to claim 1, wherein the epoxy resin (B) has a viscosity measured with an ICI cone/plate viscometer according to ASTM D4287 at 150° C. of from 0.005 to 0.01 Pa·s.

3. The epoxy resin composition according to claim 1, wherein the epoxy resin (A) has an epoxy equivalent of from 120 to 170.

4. The epoxy resin composition according to claim 1, wherein the phenolic curing agent (C) is selected from the group consisting of cresol novolac resins, phenolic resins containing naphthalenic backbone, and aralykyl type phenolic resins containing biphenyl backbone.

5. The epoxy resin composition according to claim 1, wherein the inorganic filler is spherical fused silica.

6. A semiconductor device encapsulated with the epoxy resin composition according to any one of claims 1, 2 and 3-5.

7. The semiconductor device according to claim 6, wherein the semiconductor device is surface mounted on a substrate.

8. The epoxy resin composition according to claim 1, further comprising other epoxy resins.

9. The epoxy resin composition according to claim 8, wherein the other epoxy resins include novolac type epoxy resins; triphenol alkane epoxy resins; biphenyl type epoxy resins; phenolaralykyl type epoxy resins, biphenylaralkyl type epoxy resins, heterocyclic type epoxy resins, naphthalenic backbone-containing epoxy resins besides the epoxy resin (A); bisphenol type epoxy resins; stilbene type epoxy resin; halogenated epoxy resin; and a mixture thereof.

* * * * *